US011626934B1

(12) United States Patent
Tully et al.

(10) Patent No.: US 11,626,934 B1
(45) Date of Patent: Apr. 11, 2023

(54) PROBABILITY-BASED CAPTURE OF AN EYE DIAGRAM ON A HIGH-SPEED DIGITAL INTERFACE

(71) Applicant: Amazon Technologies, Inc., Seattle, WA (US)

(72) Inventors: Brendan Tully, Phoenix, AZ (US); Teja Adike, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/356,325

(22) Filed: Jun. 23, 2021

(51) Int. Cl.
*H04B 3/46* (2015.01)
*H04B 17/23* (2015.01)
*H04L 7/00* (2006.01)
*H04B 17/29* (2015.01)

(52) U.S. Cl.
CPC ............ *H04B 17/23* (2015.01); *H04B 17/29* (2015.01); *H04L 7/0016* (2013.01)

(58) Field of Classification Search
CPC ..... H03M 1/442; H04M 1/164; H04M 1/1215
USPC ........................................................ 375/224
See application file for complete search history.

(56) References Cited

U.S. PATENT DOCUMENTS

| 10,401,391 | B1* | 9/2019 | Wei | H03M 1/0663 |
| 2016/0209462 | A1* | 7/2016 | Choi | H04B 3/46 |
| 2017/0083033 | A1* | 3/2017 | Park | G05F 1/59 |
| 2018/0091148 | A1* | 3/2018 | Mohd Yusof | H03K 19/0005 |
| 2019/0179353 | A1* | 6/2019 | Zhao | G06F 3/0416 |
| 2020/0066316 | A1* | 2/2020 | Cheng | G11C 7/1057 |
| 2021/0218919 | A1* | 7/2021 | Wang | H04N 5/37457 |

* cited by examiner

Primary Examiner — Khai Tran
(74) Attorney, Agent, or Firm — Klarquist Sparkman, LLP

(57) ABSTRACT

An eye diagram is generated for a digital interface, such as a Serializer/Deserializer (SerDes) interface. A probability map is captured by stepping through a fixed sequence of phase and reference voltage levels and counting a number of highs or lows. The switching of phase includes merely increasing the phase difference rather than performing complex phase/data analysis. The probability map can then be used to generate an eye diagram through simple differentiation. For example, the differentiation between various pixel locations in the probability map can be used to yield the edges of the eye in an eye diagram. The standard Serdes parameters can then be extracted from the eye diagram. The parameters can then be used to determine if the serial connection is problematic.

21 Claims, 14 Drawing Sheets

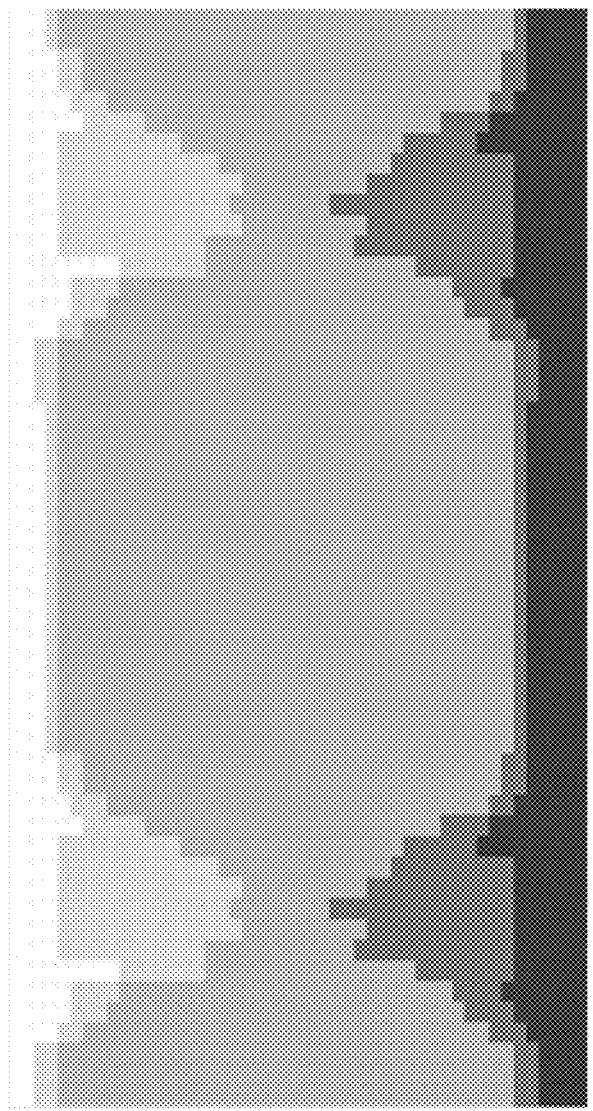
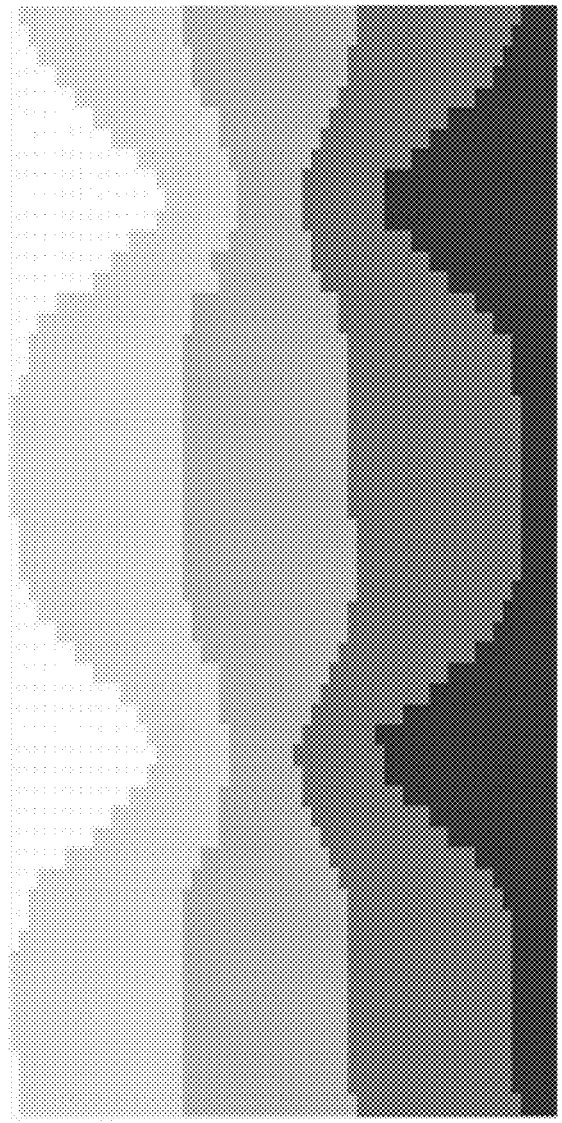
FIG. 13A
FIG. 13B

PROBABILITY-BASED CAPTURE OF AN EYE DIAGRAM ON A HIGH-SPEED DIGITAL INTERFACE

BACKGROUND

Modern high-speed serial interfaces (e.g., Serializer/Deserializer (SerDes)) typically include special circuitry within a physical layer (Phy) to allow for parametric measurements of a received serial bit stream. Eye diagrams can be used to determine digital signal quality of such serial bit streams. An eye diagram generally superimposes successive waveforms to create a composite image. The data transitions from low-to-high and high-to-low, when superimposed, create a shape of an eye, which is useful in finding distortion in signal quality. Generally, the more shut the eye appears, the poorer the signal quality, while the more open indicates good signal quality. The parametric measurements can be used for capturing the eye diagram and determining an eye opening and the transmission channel artifacts.

Classically, eye-diagram creation requires the sampling of the serial bit stream, then splitting into unit interval (UI) windows and overlaying each window on top of each other. Most embedded eye-capture systems feature methods to sample at the signals data-rate with varying phase and comparator levels, commonly referred to as a walking strobe. The most naïve systems require the signal to be repeating over a fixed period and the user to capture this stream and construct the eye. Later systems compare the "mission data-stream" to a variably delayed/sliced replica "scope data-stream" and infer the bounds of the eye by noting at what phase shift and slice voltage the streams mismatch. While such a system can work with arbitrary non-repeating data, it requires aligning the scope data to the mission data intelligently (requiring if/then control loops)

BRIEF DESCRIPTION OF THE DRAWINGS

FIG. 13A is an example 1 bit/level probability density map.

FIG. 13B is an example PAM4 probability density map.

DETAILED DESCRIPTION

Figure 1:
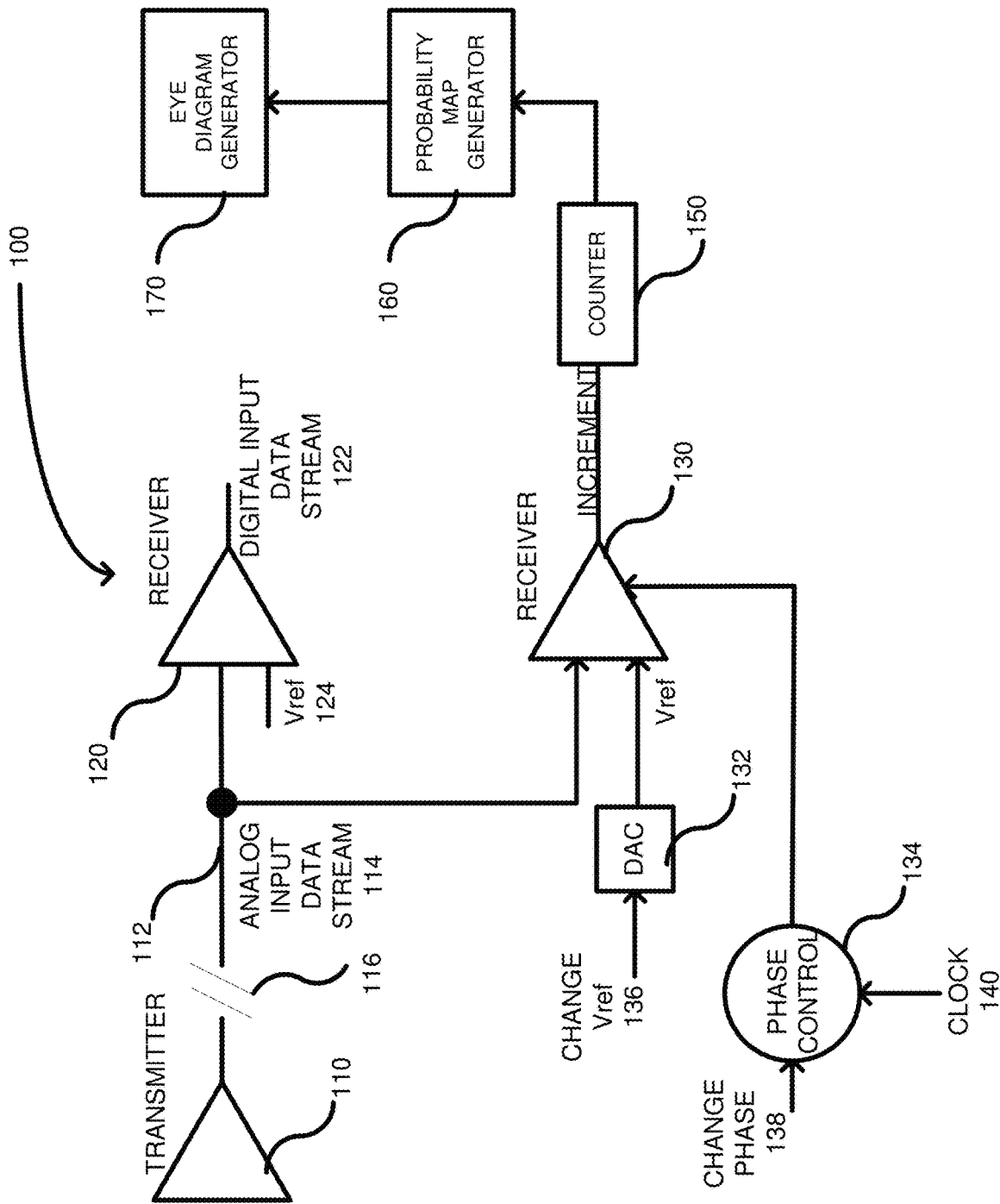
FIG. 1 is a circuit diagram for generating an eye diagram from an input data stream.

A method and circuit are disclosed that eliminate the need for complex phase alignment of signals and reduce hardware costs when analyzing a connection (such as a serial connection or a parallel). For example, without performing complex phase alignment (finding a phase where a data transitions occur), the need for a complex processor/controller is reduced. Additionally, a multi-bit comparator can be eliminated. The system takes advantage of the fact that the SerDes protocol produces a 50-50 split of highs and lows over any fixed sampling interval. This is referred to as DC-balanced, as serial protocols take steps to monitor and correct logic disparities (count of 1s vs 0s) through the use of encoding (such as 8 b/10 b), pseudo randomizing circuitry and insertion of data inert DC re-balancing data packets chosen to correct accumulated disparities in transmitted logic state count. A probability map is captured by stepping through a fixed sequence of phase and reference voltage levels and counting a number of highs or lows. The switching of phase includes merely increasing the phase difference at fixed amounts rather than performing complex phase/data analysis. The probability map can then be used to generate an eye diagram through simple differentiation. For example, the differentiation between various pixel locations in the probability map can be used to yield edges of an eye in an eye diagram. The differentiation can be between pixels in rows, columns or on diagonals. The standard SerDes parameters can then be extracted from the eye diagram. The parameters can then be used to determine if the serial connection is problematic. One advantage of the method and circuit is that it operates on deterministic or non-deterministic data.

Thus, a full eye diagram can be captured using blind register reads and a pre-recorded sequence of sampling phase and comparator voltage updates. In one example, the analog input stream is compared to programmable voltage over a fixed number of UIs, and a counter is incremented every time a bit is detected as logic high. Therein, the probability of capturing a logic high is known at that discreet compare voltage (count detected)/(total number of UIs compared). In the open eye area, a 50% match occurs (SerDes is DC balanced and contains an approximate 50-50 split of 1 and 0s at any fixed sampling interval within the open eye over a suitably sized count of UIs.) This sample point can traverse in time and voltage and the percentage changes in a statistically predictable manner. For example, if the threshold is set above the most positive voltage of the signal, there is a 0% probability of capturing a logic high at any phase. If the threshold is set below the lowest values of the signal, there is a 100% probability of capturing a logic high at any phase. By sweeping the sample phase and voltage, a probability map (a 2-dimensional image) is created. A classic eye diagram is then generated by differentiating the 2-dimensional image. From this classic eye diagram, the standard SerDes parameters can be extracted.

FIG. 1 is a circuit 100 used for determining signal integrity of a digital interface, such as an interface used for communicating between host server computers. For example, the circuit 100 can be on a network interface card (NIC) on a host server computer. A transmitter 110 is coupled to a transmission cable 112 for transmitting an analog output data stream 114. As shown at 116, the transmission cable 112 can be any length and the transmitter 110 can be in a different host server computer than the rest of the circuit 100 to allow two server computers to communicate therebetween using the serial cable 112. The circuit 100 further includes a receiver 120 for receiving the analog input data stream 114 and converting it to a digital input data stream 122 using a voltage reference signal 124 to determine whether the signal 114 is a logic high or low. To analyze the signal integrity, a second receiver 130 analyzes the analog input data stream 114 in parallel. Accordingly, a first input of the receiver 130 is coupled to the incoming analog signal path (can be anywhere along the analog conditioning chain, pre or post attenuation, gain, equalization etc.) to receive the analog input data stream 114. A second input of the receiver 130 is coupled to a digital-to-analog converter (DAC) 132 to receive a programmable reference voltage level, Vref. A third input to the receiver 130 is coupled to a phase control circuit 134 that changes a phase (i.e., a phase shift) of an input clock signal provided to the receiver 130. Thus, the phase control circuit 134 controls when the receiver 130 latches an output signal of the receiver. The DAC 132 has an input signal 136 used to change the Vref signal input into the receiver 130. The phase control 134 also has an input signal 138 for shifting the phase of an input clock 140 to the receiver 130. The receiver 130 acts as a single-bit comparator that compares the voltage Vref against the voltage level of the analog input data stream 114. A counter 150 increments whenever the output of the receiver changes to a predetermined level, such as a logic high or low. Thus, the counter 150 can determine how many logic 1's or logic 0's occur, based upon the configuration, during a predetermined number of clock cycles for differing Vref levels and different phases. More specifically, the inputs 136, 138 can step through a predetermined sequence of voltages and phase shifts and the counter 150 counts the logic 1's or logic 0's during a fixed number of clock cycles. An example predetermined sequence can be stepping the voltage Vref from 0V through 5V at predetermined increments (e.g., 0.01V). Likewise, the phase shift can be a predetermined shift. The resultant count from the counter 150 can be output to a probability map generator 160. As described further below, the probability map generator can generate a 2-dimensional map used to establish the probability of a logic state at any voltage and phase combination. Each point or pixel in the 2-dimensional map is a different count produced by the counter 150. Additionally, each pixel has a unique Vref and shift value. An eye diagram generator 170 can use the 2-dimensional map generated by the probability map generator 160 to generate an eye diagram representative of signal integrity of the analog input data stream 114. To generate the eye diagram, the eye diagram generator 170 can perform a differential between different pixel locations in the 2-dimensional map. Edges of the eye are where the rate of change of the probability is elevated above background noise bounded by the allowable running disparity of the system. The probability map generator 160 and the eye diagram generator 170 can be accomplished in hardware, software or a combination thereof. Although the circuit is shown for capturing a logic 1 or a logic 0, the circuit can be modified to capture multi-level (e.g., 4 levels) inputs, such as by using pulse-amplitude modulation (PAM), such as PAM4.

Figure 2:
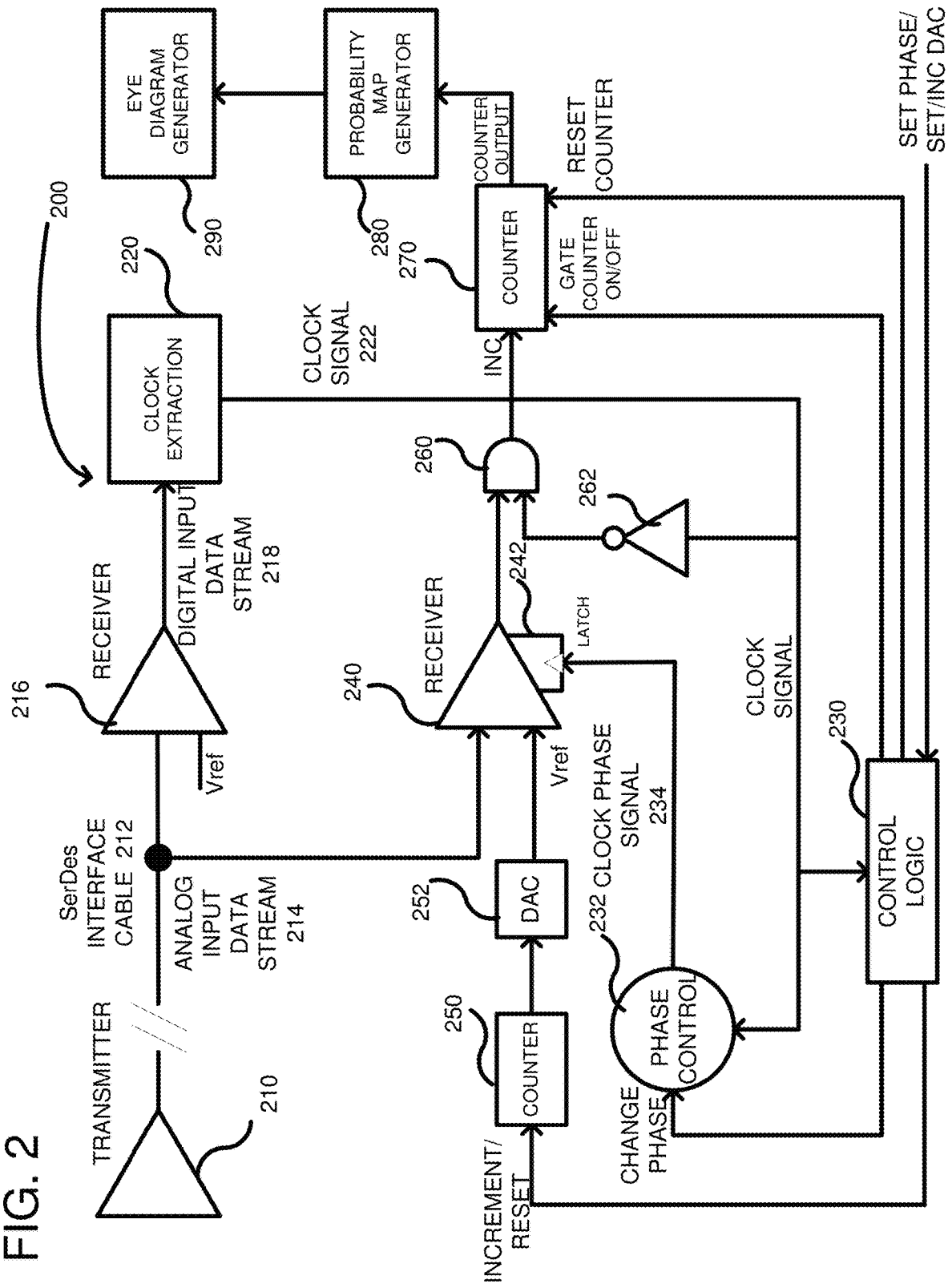
FIG. 2 is a detailed circuit diagram for generating an eye diagram from an input data stream of a SerDes interface.

FIG. 2 is a detailed example of a circuit 200 used for determining signal integrity of a serial interface, and, in this case, a SerDes interface. A SerDes transmitter 210 is coupled to a SerDes cable 212 to transmit an analog input data stream 214 to a receiver 216, which generates a digital input data stream 218. A clock extraction circuit 220 can be used to extract a clock signal 222 from the digital input data stream 218. Control logic 230 is coupled to the clock extraction circuit 220 to receive the clock signal 222 associated with the digital input data stream 218. The control logic 230 can step through a sequence of predetermined phase shifts and voltage increments to generate a 2-dimensional array of different phase shifts and corresponding different voltage increments such that each voltage/phase shift pair represents a unique pixel location in a 2-dimensional map. For example, the control logic 230 is coupled to a phase control circuit 232, which can perform a phase shift (i.e., change the phase) of a clock phase signal 234 with respect to the clock signal 222. The clock phase signal 234 is applied to a receiver 240 coupled in parallel to the receiver 216. A latch 242 (e.g., a D-type latch) receives the clock phase signal 234 and locks the receiver 240 output until a next rising edge. The control logic 230 also controls a counter 250, which can be incremented or reset by the control logic 230. The counter 250 allows the control logic 230 to provide a sequence of values to a digital-to-analog converter (DAC) 252 that converts the values into a voltage reference signal supplied to the receiver 240. In this way, the control logic 230 can easily step through an increasing number of reference voltages and phase shifts supplied to the receiver 240. The output of the receiver 240 is supplied to an AND gate 260, which has a second input coupled to the clock signal 222 through an inverter 262. The output of the AND gate 260 is supplied to a counter 270, which increments on a positive edge. The control logic 230 can also gate the counter on or off and reset the counter, as indicated through the separate control lines between the control logic and the counter 270. The control logic 230 can receive an external control signal to set the phase and/or set/increment the DAC.

An output of the counter 270 is supplied to a probability map generator 280, which uses phase and the voltage reference information, supplied by the control logic, to generate a pixel location on a probability map. In one embodiment, the probability map generator 280 can read values of the counter and store the values in a 2-dimensional array of voltage and phase steps. More particularly, the reference voltage values can represent one axis of the map and the phase shift represents another axis of the map. Thus, the particular reference voltage and phase shift identify a position or pixel on the map and the corresponding counter value represents the value of that pixel. Finally, once the probability map is completed, an eye diagram generator 290 can differentiate the pixel values in the map to generate an eye diagram. The eye diagram may one less row or column of pixels as the probability map (due to differentiation yielding an N-1 sized vector for an N sized input vector) and the edge of the eye is where a rate of change of the probability is elevated above the systems allowable running disparity within the capture window. Signal integrity can be determined by examining the pixel distances between opposite edges of the eye. For example, if the pixel distances are less than one or more predetermined thresholds, then the signal integrity can be considered poor. Conversely, if the pixel distances are greater than the predetermined thresholds, then the signal integrity is acceptable.

Figure 3:
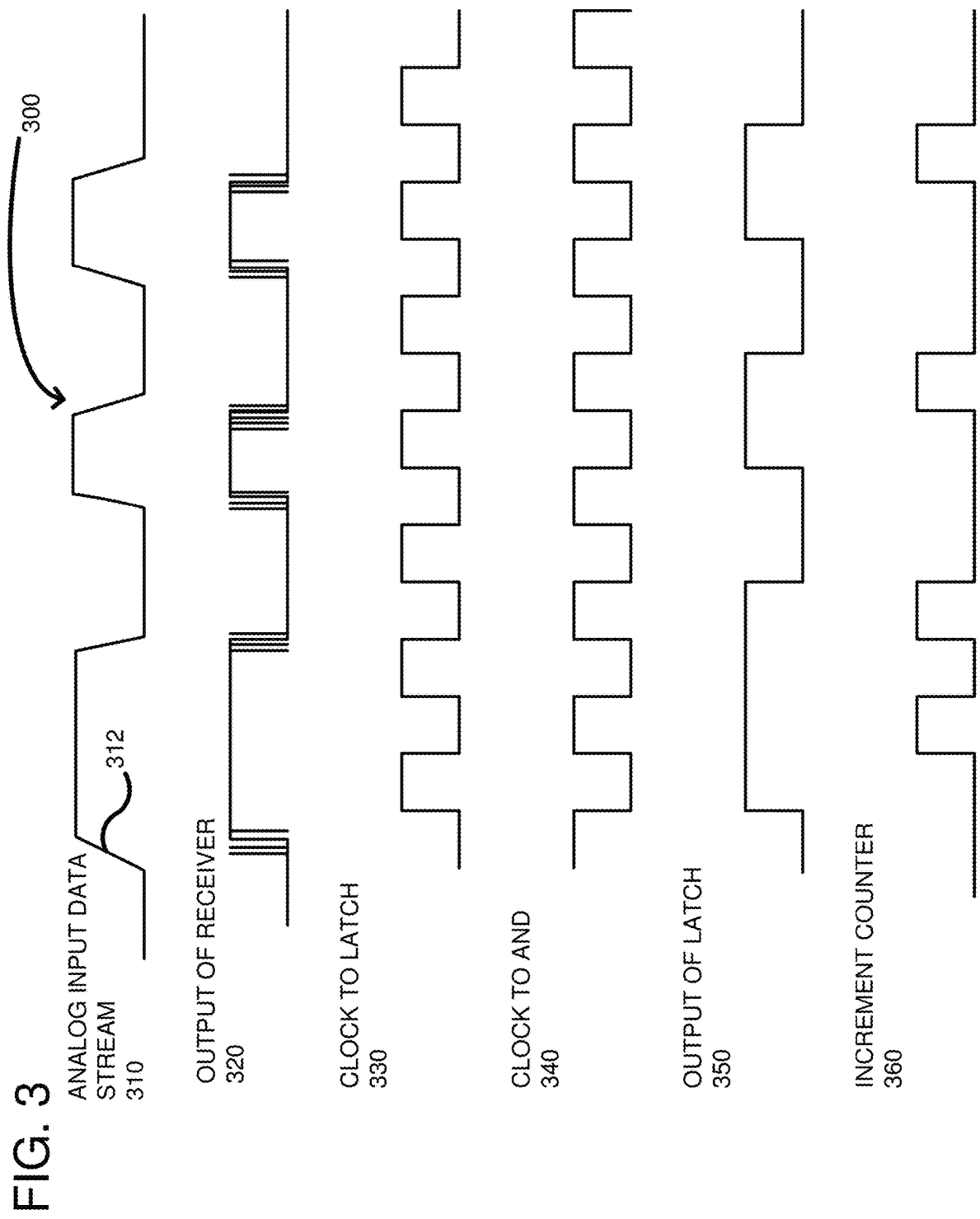
FIG. 3 is a timing diagram for the circuit of FIG. 2.

FIG. 3 is a timing diagram 300 for the circuit of FIG. 2. An analog input data stream is shown at 310 and is an example of the data stream 214 of FIG. 2. Notably, the rising and falling edges, such as rising edge 312, have a measurable rising and falling time. The output of the receiver 240 is shown at 320 (noise is illustrated around the clock edges). Depending on the Vref signal to the receiver 240, the output 320 closely follows the analog input data stream 310. The clock phase signal 234 is shown at 330. The clock signal to the AND gate 260 is shown at 340 and is the inverted signal of clock 330 due to the inverter 262. The output of the flip flop 242 is shown at 350. Finally, at 360, the output of the AND gate 260 is shown, which increments the counter 270 on every rising edge.

Figure 4:
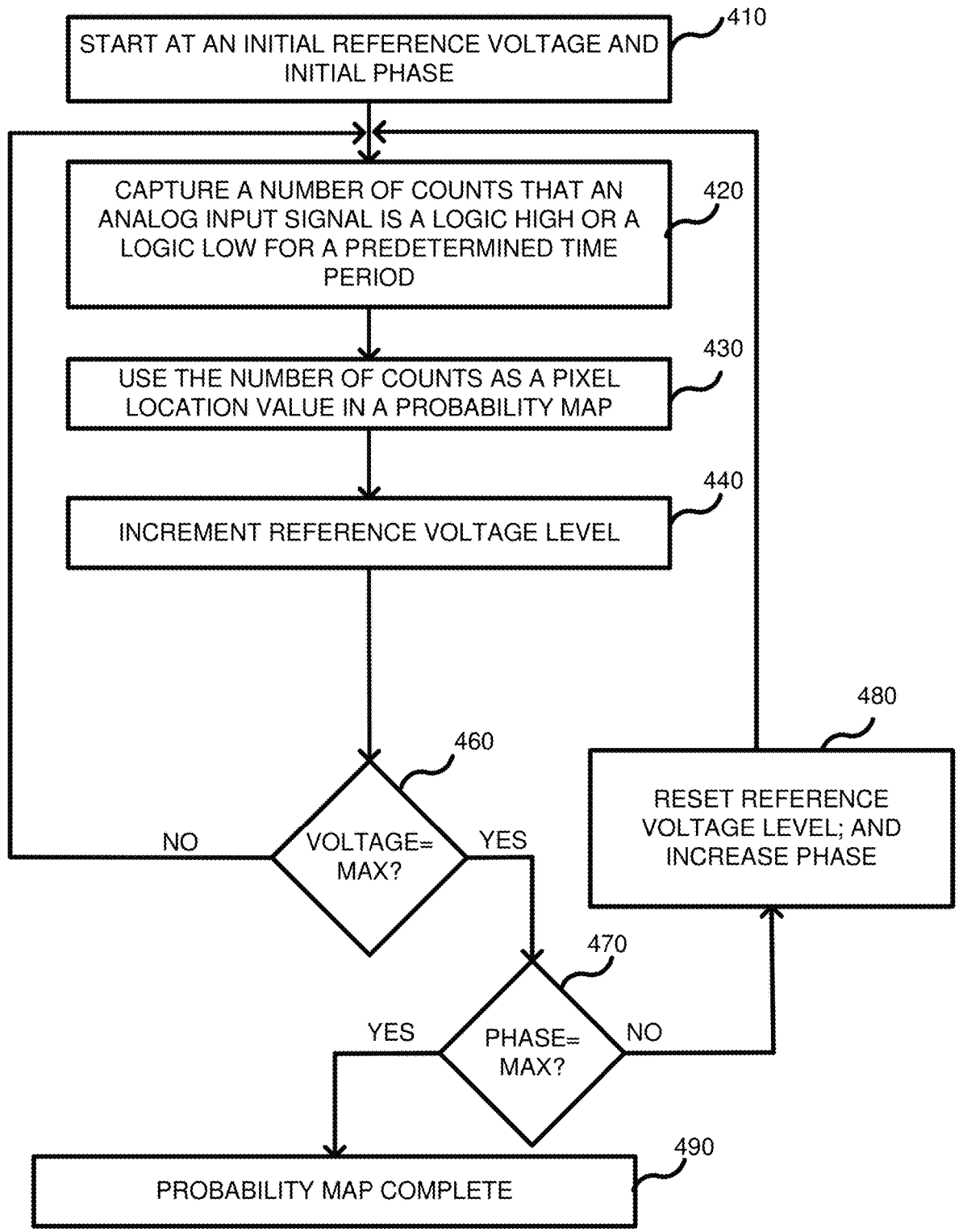
FIG. 4 is a flowchart according to one embodiment for generating a probability map using the circuits of FIG. 1 or 2.

FIG. 4 is a flowchart for generation of a probability map by the probability map generator 160. In process block 410, an initial reference voltage and initial phase are selected. For example, the control logic 230 (FIG. 2), can select an initial phase shift relative to the clock signal 222 and an initial reference voltage. In one example, the initial phase shift can be zero degrees shift from the clock signal and the initial reference voltage can be obtained by resetting the counter 250 to obtain a base voltage. In process block 420, a number of counts are captured that the analog signal is a logic high or low (depending on the hardware configuration) for a predetermined time period. For example, the control logic 230 can turn on the counter 270 using the gate counter ON input and wait a predetermined period of time before turning the gate counter OFF. The predetermined period of time can remain constant for each pixel calculation in the probability map. In one example, the counter 270 counts how many logic highs are received in a 100 microsecond period. In process block 430, the number of counts is used as a pixel value in the probability map and that pixel value is placed at a coordinate location based upon the reference voltage used (or the value of counter 250) and the phase shift used. In process block 440, the reference voltage level is increased, such as by incrementing the counter 250. In decision block 460, a determination is made whether the voltage has reached a maximum, indicating, for example, that a first column of the probability map is complete. If decision block 460 is answered in the negative, then process blocks 420, 430 and 440 are repeated using the same phase shift. However, if the voltage is a maximum, then in decision block 470, a phase shift value is compared to a maximum phase shift value. If the phase shift has not reached its maximum value, then in process block 480, the count for the reference voltage is reset (e.g., counter 250 is reset) and the phase shift is increased (i.e., starting a new column of the probability map). Process blocks 420, 430 and 440 are then repeated for the new phase shift. If decision block 470 indicates that the maximum phase shift has been reached, then the probability map is complete (process block 490) as all of the different phase shifts and reference voltages have been analyzed.

Figure 5:
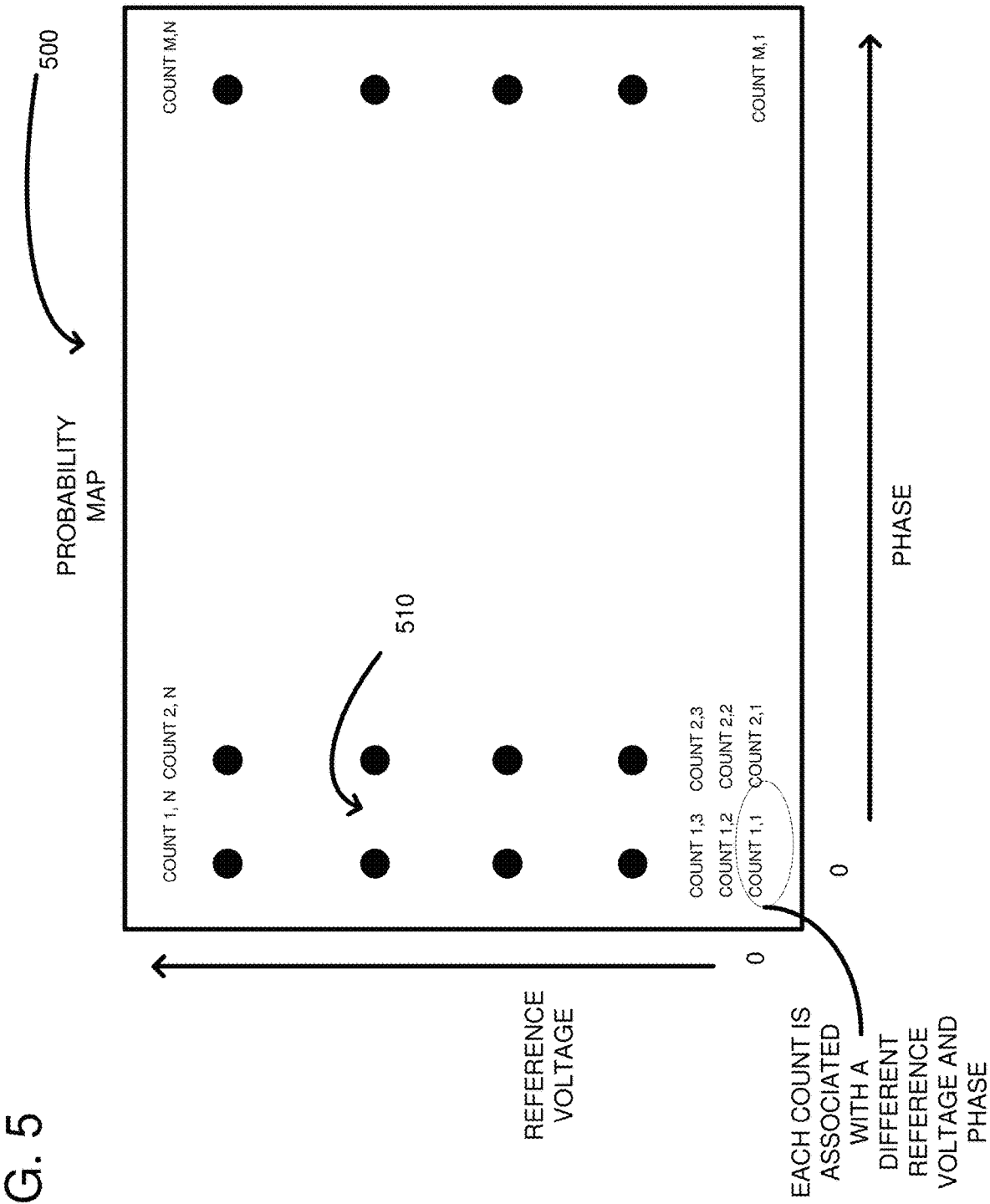
FIG. 5 is an example probability map wherein each pixel on the probability map is associated with a phase shift and a reference voltage.

FIG. 5 shows an example probability map 500, which includes a collection of points or pixels, such as is shown at 510, with each point being associated with a different reference voltage and a different phase shift. For example, in FIG. 2, the different reference voltages can be represented by the values in the counter 250 and the different phase shifts can be represented by the inputs or outputs of the phase control 232. For each point, a different count is collected to generate the overall probability map 500. For example, in FIG. 2, the counts collected in counter 270 over a predetermined period can be used as a value for each point 510. While the Y-axis is shown as reference voltages and the X-axis is shown as phase shifts, the axes can be swapped. The counts are shown generically as count 1, 1 through count M,N, wherein each column is shown having N counts (wherein N is any integer value) and each row is shown having M counts (wherein M is any integer value). Thus, each column has counts for a same phase and N different voltage reference values, while each row has counts for a same voltage reference and M different phases. The resultant probability map represents a probability for the associated reference voltage and phase that the output is a logic high, for example. Thus, when completed, the probability map is filled with a plurality of numbers, each number representing a count obtained by the counter (270 in FIG. 2) for a unique voltage/phase combination. The increments along the X axis represent different phases used in the phase control 232, while the increments along the Y axis represent different counts in the counter 250. In the simplest example, with the phase control 232 at a minimum value and the counter 250 at a minimum value, the value obtained by the counter 270 is stored at the location count 1,1 in the map.

Figure 6:
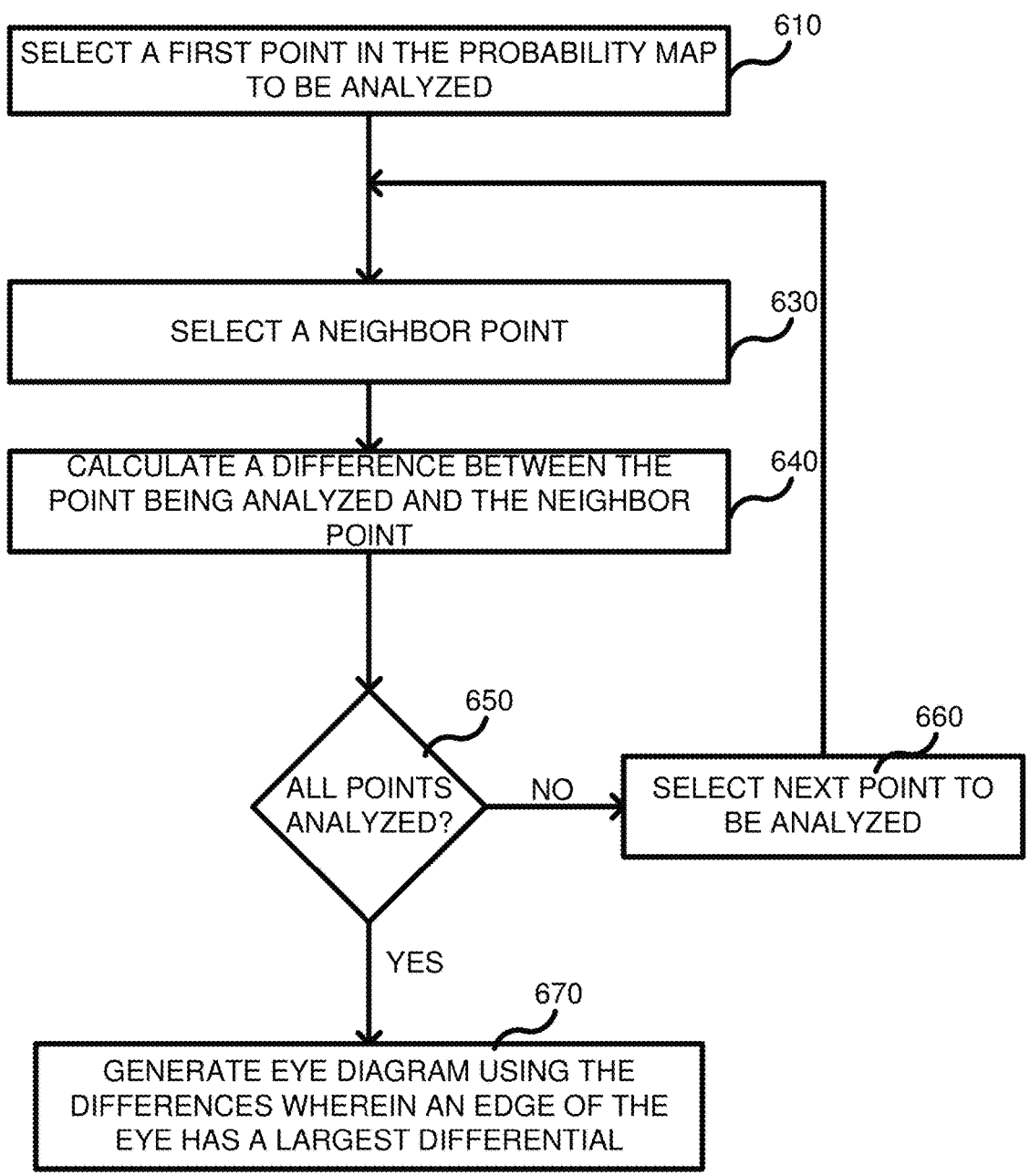
FIG. 6 is a flowchart according to one embodiment for generating an eye diagram from the probability map of FIG. 5.

FIG. 6 is a flowchart according to one embodiment for generating an eye diagram using the probability map, such as is shown in FIG. 5 at 500. In process block 610, a first point in the probability map is selected to be analyzed. For example, count 1 shown in FIG. 5 can be selected. In process block 630, a neighbor point can be selected. In process block 640, a difference can be calculated between the count for the point being analyzed and the neighbor point. The difference calculation results in a differentiation between pixel values being determined. In decision block 650, a check is made whether all points in the probability map have been analyzed. If not, then in process block 660, a next point is selected and process blocks 620, 630, and 640 are repeated. If decision block 650 is answered in the affirmative, then in process block 670, an eye diagram is generated using the differences. The edge of the eye is an area where a the rate of probability change rises above the background system running disparity noise experienced during the capture period, though if the period is long enough this is proportionally reduced.

Figure 7:
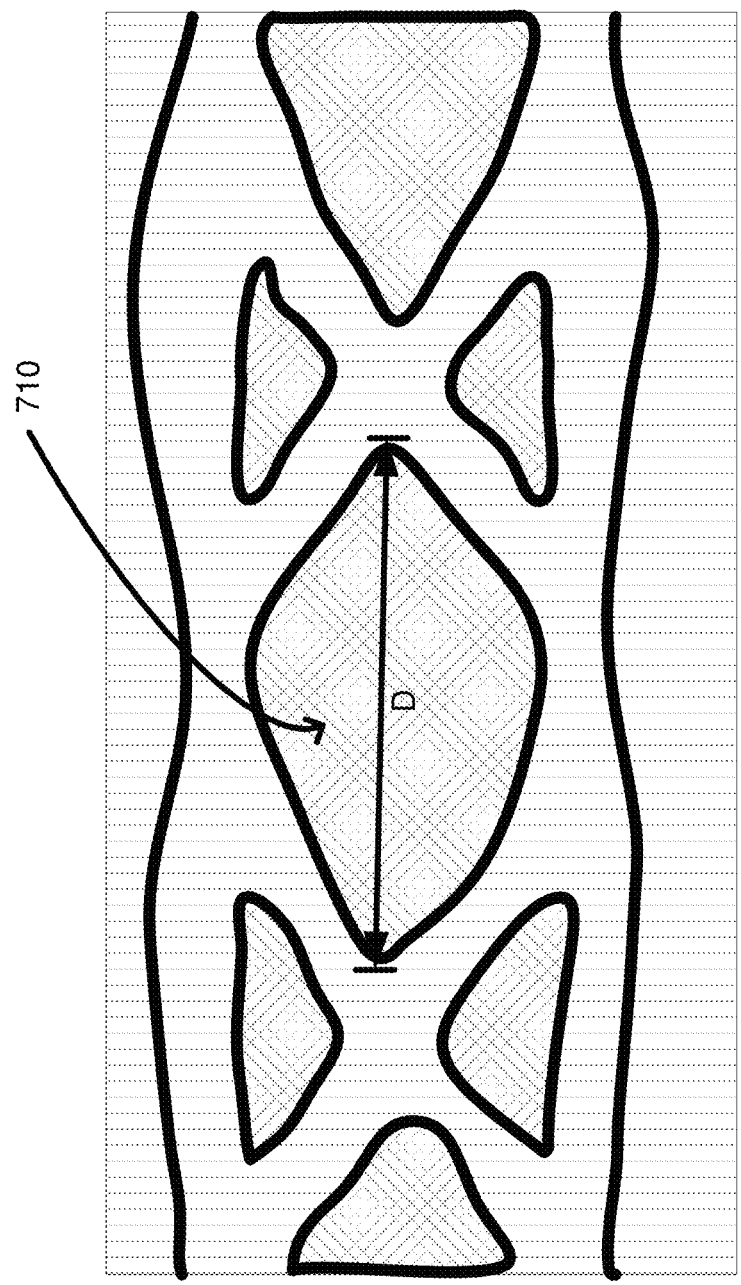
FIG. 7 shows an example eye diagram.

FIG. 7 shows an example eye diagram, wherein the area of probability change is shown within in dark lines. Typically, an eye is formed, such as is shown at 710, and how open or closed the eye is indicates whether the signal integrity is good or bad. Calculations can be made between edges of the eye to determine if the distance exceeds a threshold. Note the system allowable running disparity may contribute noise to the 50% eye opening area, though this will be statistically small for relatively large UI capture sizes, as such the eye edge will be determined as the pixel where the differentiated count is above this statistical noise. If the distance exceeds the threshold, then the eye is sufficiently open. For example, a distance D is shown that is a measure of the width of the eye. A corresponding height of the eye can also be determined. Both the width and height measurements can be compared to predetermined thresholds. If the eye is closed and the distances do not reach the threshold, then the signal integrity is problematic. In such a case, a message can be transmitted to a technician to examine the host server computer for problems.

Figure 8:
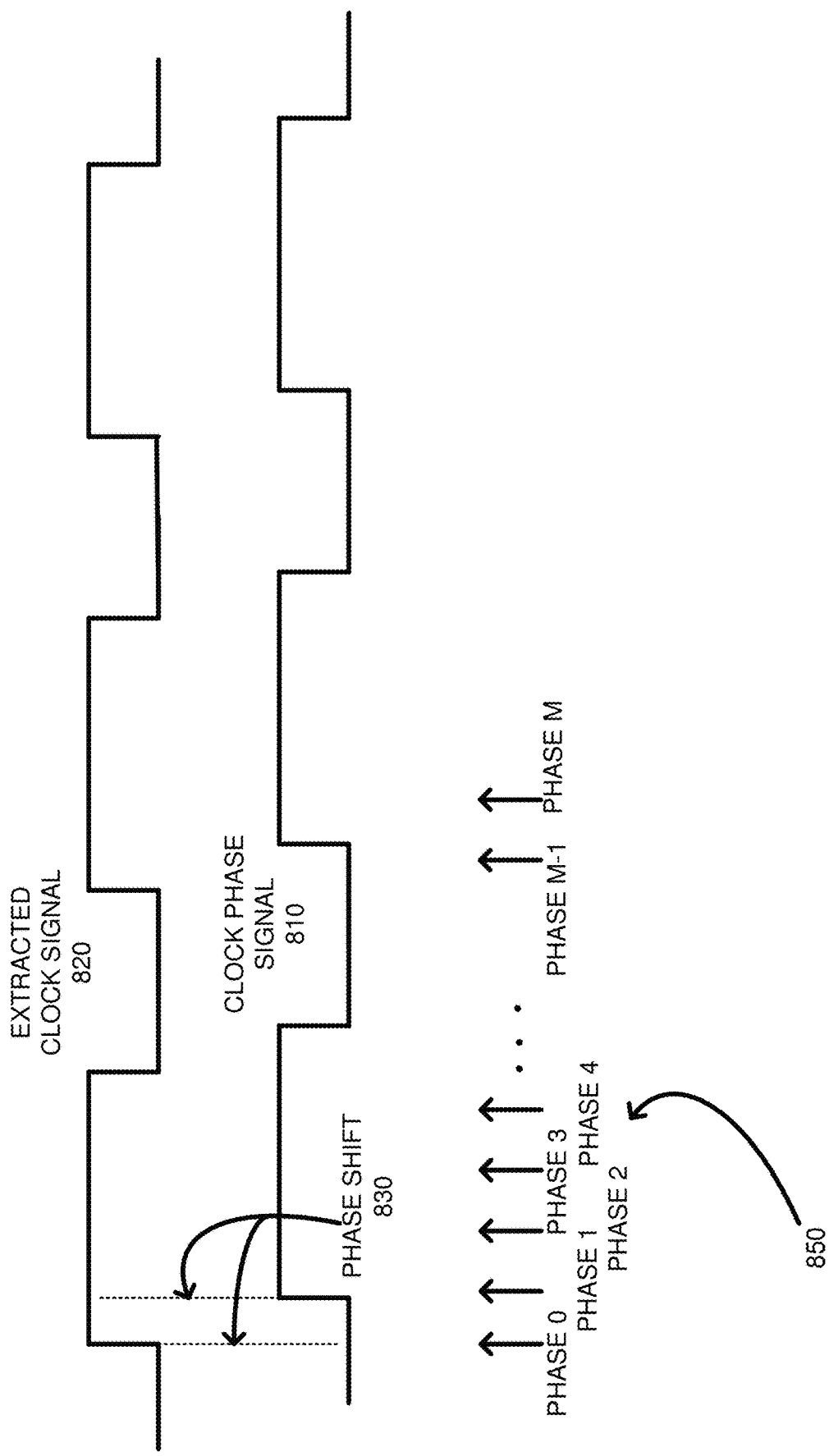
FIG. 8 shows a phase shift of a clock phase signal relative to an extracted clock signal.

FIG. 8 shows an example of how the clock phase signal 810 is shifted relative to the extracted clock signal 820. For example, the clock phase signal can be the signal 234 in FIG. 2, while the extracted clock signal can be the clock signal 222. A phase shift 830 is shown indicating that there is a shift of when the leading edges of the clock signal occur such that the clock phase signal moves relative to the extracted clock signal. As shown at 850, the leading edges (indicated as arrows) for the clock phase signal 810 can be moved M times (where M is any integer value). Each phase 850 represents a pixel (see FIG. 5 with phases 0-M). The phases 850 can start slightly before the rising edge of the clock phase signal 810 and end slightly after the falling edge.

Figure 9:
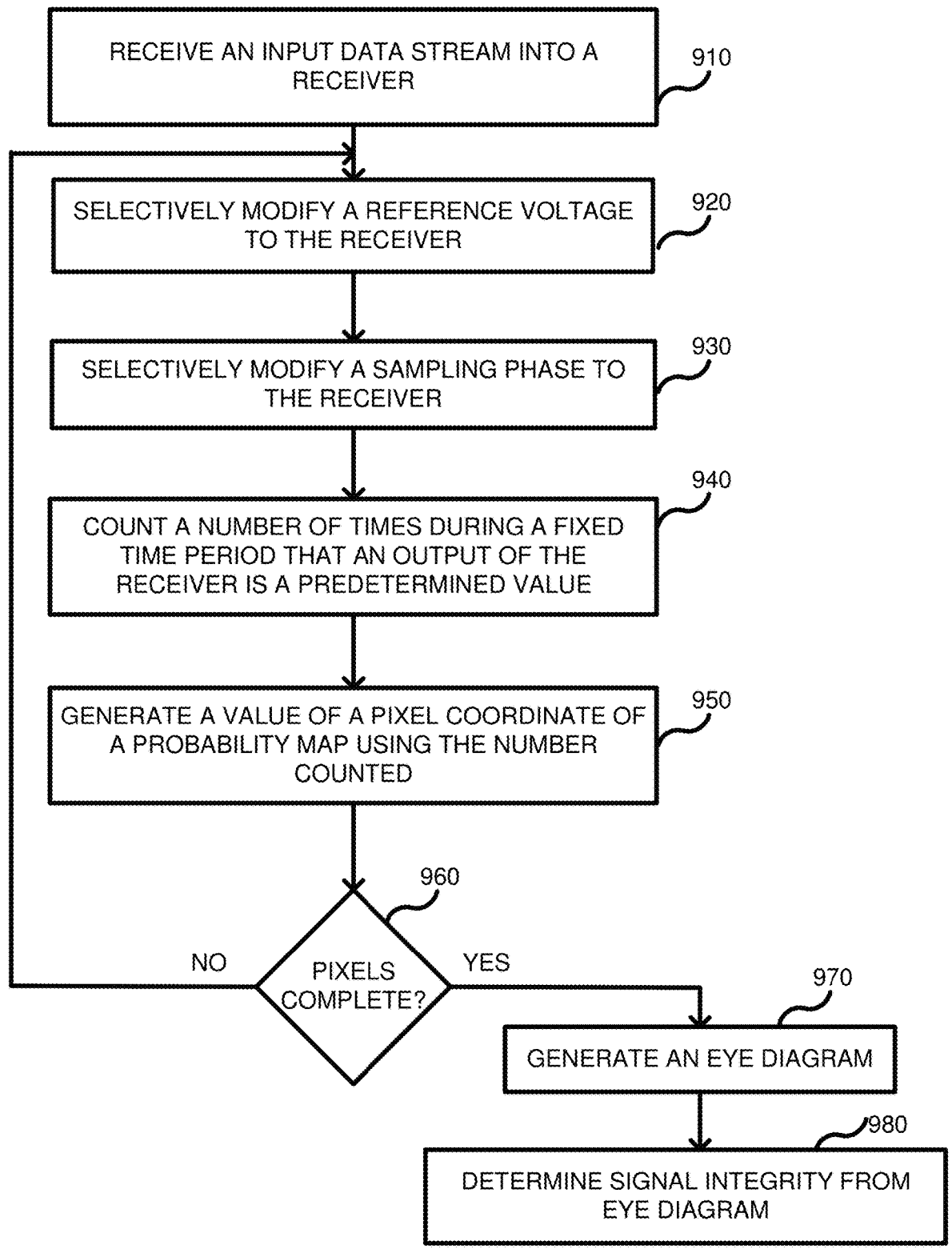
FIG. 9 shows a flowchart according to one embodiment for generating an eye diagram from an input data stream.

FIG. 9 is a flowchart according to one embodiment for generating an eye diagram from an input data stream. In process block 910, an input data stream is received in a receiver. For example, in FIG. 2, the input data stream 214, which is an analog data stream, is received in receiver 240 for conversion into a digital data stream. In process block 920, a voltage threshold to the receiver is selectively modified. For example, in FIG. 2, the Vref signal can be changed using the counter 250 in conjunction with the DAC or directly programmed by control logic 252. The control logic 230 need not modify the Vref signal every time the phase is changed. In process block 930, a sampling phase to the receiver is selectively modified. In FIG. 2, the phase control 232 can be modified by the control logic 230 to adjust the phase of the clock phase signal 234. In some instances, phase can be held constant while a column of the probability map is being generated. Thus, phase can be selectively modified to change phase once a column is complete to move to the next column. In process block 940, a count is generated of a number of times during a fixed time period that an output of the receiver is a predetermined value (logic high or low). For example, in FIG. 2, the counter 270 can count a number of logic high's, such as by incrementing on a transition from low to high. In alternative embodiments, the number of logic lows can be determined. Additionally, either edge of the input data stream can be used to increment the counter. The count is usually set for a predetermined period of time. Thus, the Vref and clock phase signal 234 can remain fixed for a period of time while the counter counts the number of logic highs or logic lows that occur during that period. In process block 950, a value of a pixel coordinate is generated for the probability map using the number counted. Thus, the Vref and clock phase signal corresponding to the count represent a unique location on a two-dimensional image and the count is the value associated with that unique location. In decision block 960, a check is made whether each pixel in the probability map has been assigned a count. If not, then a next reference voltage/sampling phase shift combination is selected and process blocks 940, 950 are repeated. If decision block 960 is decided in the affirmative, the in process block 970, the eye diagram can be generated using the probability map using a differentiation of the probability map. In process block 980, a signal integrity can be determined from the eye diagram. For example, a height and width of the eye can be determined and compared to corresponding thresholds to determine whether there are issues with the incoming signal.

Figure 10:
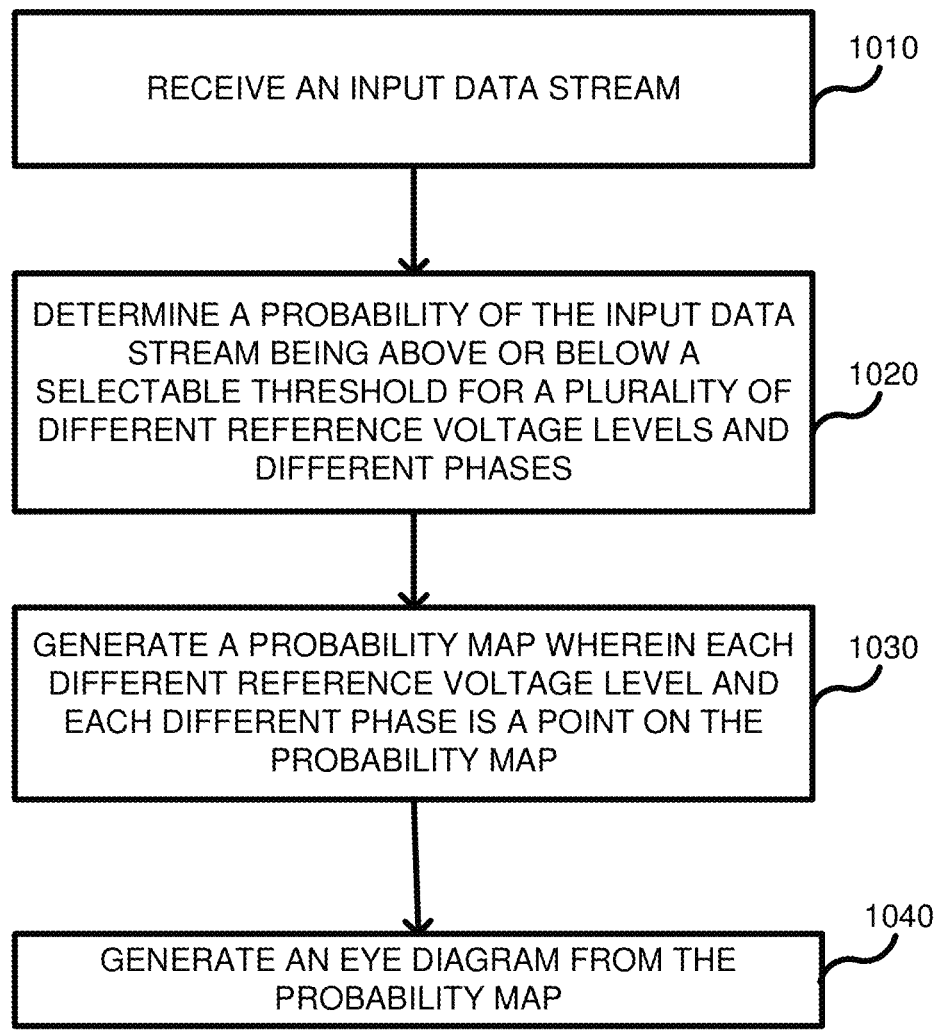
FIG. 10 shows a flowchart according to another embodiment for generating an eye diagram from an input data stream.

FIG. 10 is a flowchart according to another embodiment. In process block 1010, an input data stream is received. Generally, the input data stream is an analog data stream. For example, FIG. 1 shows an analog data stream received by a receiver 130. The receiver 130 acts as a comparator and outputs a logic high if the analog data stream is greater than Vref, and outputs a logic low if the analog data stream is less than Vref. In process block 1020, a probability is determined of the input data stream being above or below a selectable threshold (e.g., a logic low or a logic high) for a plurality of different reference voltage levels and a plurality of different phases. For example, in FIG. 2, the clock phase signal 234 is a clock signal have a plurality of phase shifts that occur as dictated by the phase control 232. Also, the Vref input to the receiver 240 is changed in accordance with the counter 250 and DAC 252 or directly programmed. These two inputs to the receiver 240 can be changed and held for a period of time to count how many logic 1's or logic 0's occur. The resultant count is a probability result for each particular Vref and phase. In process block 1030, a probability map is generated wherein each different reference voltage level and each different phase is a point on the probability map. For example, in FIG. 5, each point 510 is a count associated with a particular Vref value and a particular phase shift with respect to an extracted clock signal (see phase shift 830, FIG. 8). In process block 1040, an eye diagram is generated from the probability map. For example, FIG. 7 shows an eye diagram, which is derived from calculating a plurality of differentiations between pixels in the probability map.

Figure 11:
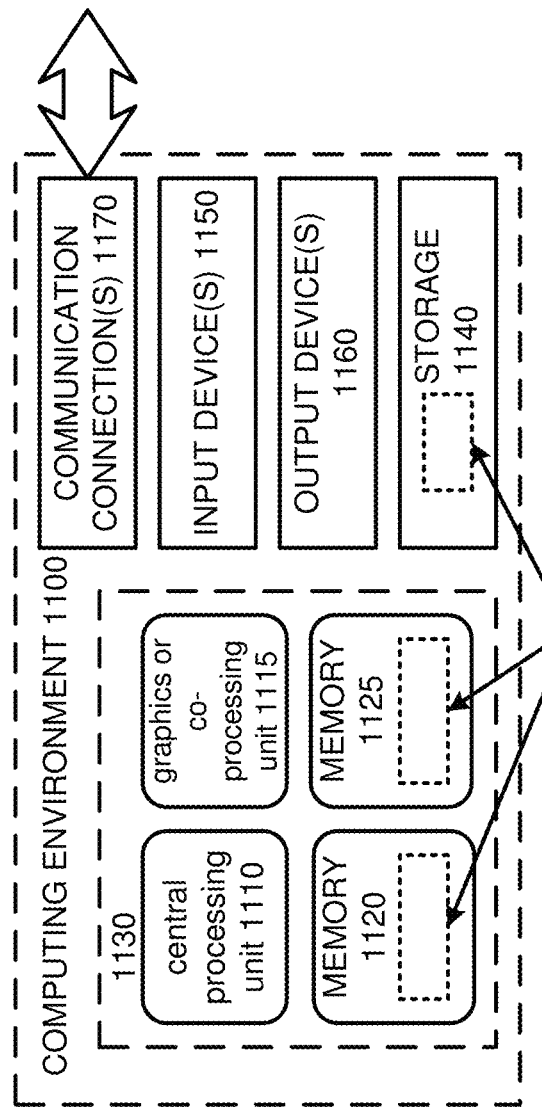
FIG. 11 depicts a generalized example of a suitable computing environment in which the described innovations may be implemented.

FIG. 11 depicts a generalized example of a suitable computing environment 1100 in which the described innovations may be implemented. The computing environment 1100 is not intended to suggest any limitation as to scope of use or functionality, as the innovations may be implemented in diverse general-purpose or special-purpose computing systems. For example, the computing environment 1100 can be any of a variety of computing devices (e.g., desktop computer, laptop computer, server computer, tablet computer, etc.).

With reference to FIG. 11, the computing environment 1100 includes one or more processing units 1110, 1115 and memory 1120, 1125. In FIG. 11, this basic configuration 1130 is included within a dashed line. The processing units 1110, 1115 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 11 shows a central processing unit 1110 as well as a graphics processing unit or co-processing unit 1115. The tangible memory 1120, 1125 may be volatile memory (e.g., registers, cache, RAM), non-volatile memory (e.g., ROM, EEPROM, flash memory, etc.), or some combination of the two, accessible by the processing unit(s). The memory 1120, 1125 stores software 1180 implementing one or more innovations described herein, in the form of computer-executable instructions suitable for execution by the processing unit(s). For example, one or more features of the computing environment 1100 can be used to implement the control logic 230, FIG. 2. Additionally, the computing environment 1100 can be used for implementing the probability map generator 160 or the eye diagram generator 170 (FIG. 1).

A computing system may have additional features. For example, the computing environment 1100 includes storage 1140, one or more input devices 1150, one or more output devices 1160, and one or more communication connections 1170. An interconnection mechanism (not shown) such as a bus, controller, or network interconnects the components of the computing environment 1100. Typically, operating system software (not shown) provides an operating environment for other software executing in the computing environment 1100, and coordinates activities of the components of the computing environment 1100.

The tangible storage 1140 may be removable or non-removable, and includes magnetic disks, magnetic tapes or cassettes, CD-ROMs, DVDs, or any other medium which can be used to store information in a non-transitory way and which can be accessed within the computing environment 1100. The storage 1140 stores instructions for the software 1180 implementing one or more innovations described herein.

The input device(s) 1150 may be a touch input device such as a keyboard, mouse, pen, or trackball, a voice input device, a scanning device, or another device that provides input to the computing environment 1100. The output device(s) 1160 may be a display, printer, speaker, CD-writer, or another device that provides output from the computing environment 1100.

The communication connection(s) 1170 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Figure 12:
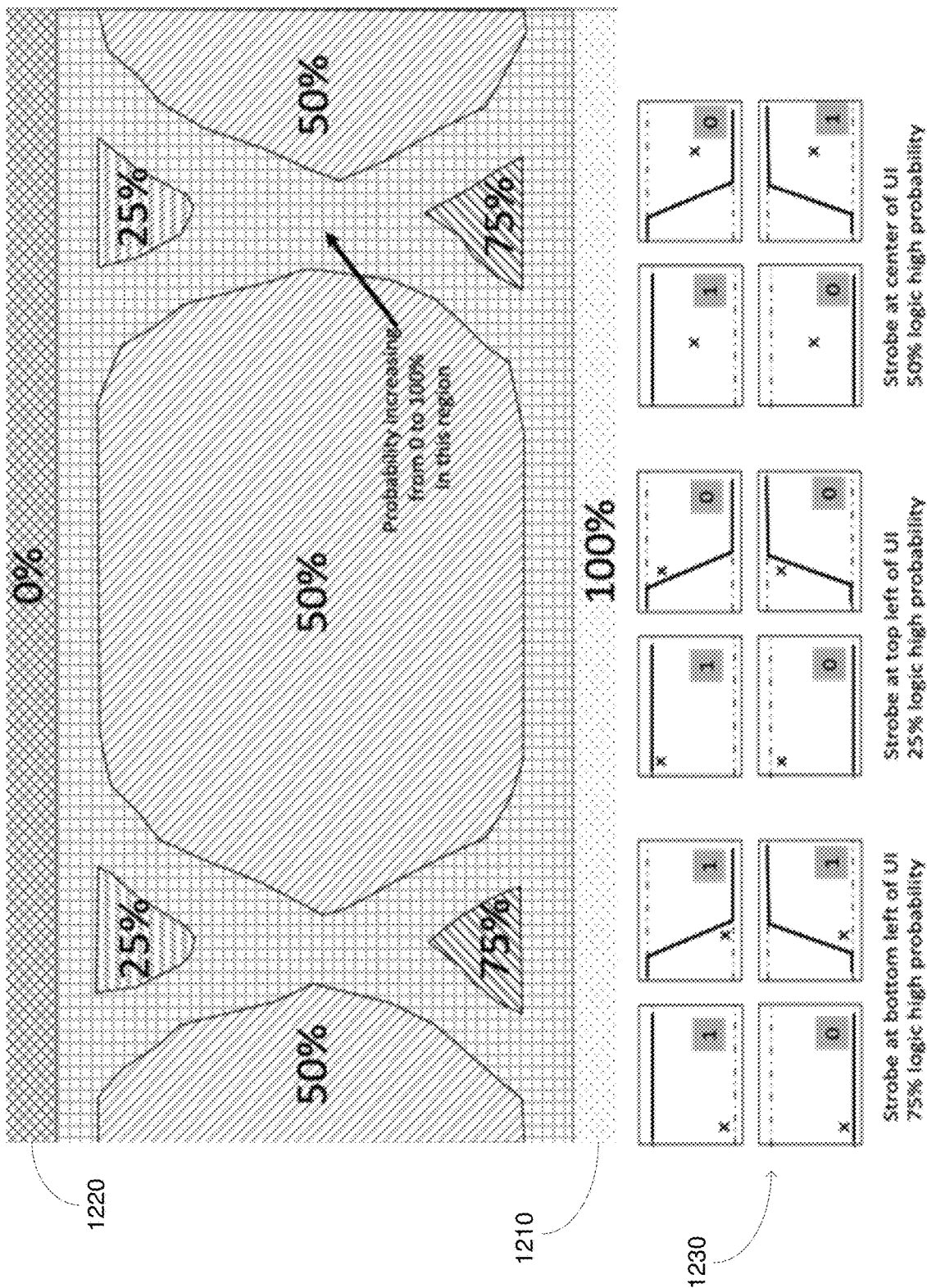
FIG. 12 is an example of a 1 bit/level probability map and associated probabilities in transition zones.

FIG. 12 is an example of a 1 bit/level probability map and associated probabilities in transition zones. With a reference voltage level set below the eye, all of the UIs are detected as a logic high as shown at 1210. Thus, there is a 100% probability of logic ones for all phases at this level. With a reference voltage level set above the eye, all UIs are detected as a logic low, as shown at 1220. Thus, there is a 0% probability of logic ones for all phases at this level. At a midpoint, there is a 50% probability of a logic high. Additionally, transition zones are shown at discrete areas of 75% and 25% At 1230, shows various waveform transitions with an X representing a strobe point and a shaded box illustrating a comparator output.

FIG. 13A shows a 1 bit/level probability density map. FIG. 13B shows a PAM4 probability density map. The probability density maps of FIGS. 13A, 13B are differentiated in a single axis. Areas that show a rate of change, with probabilities increasing/decreasing, are where the strobe point has crossed a transition trace.

Figures 14A, 14B:
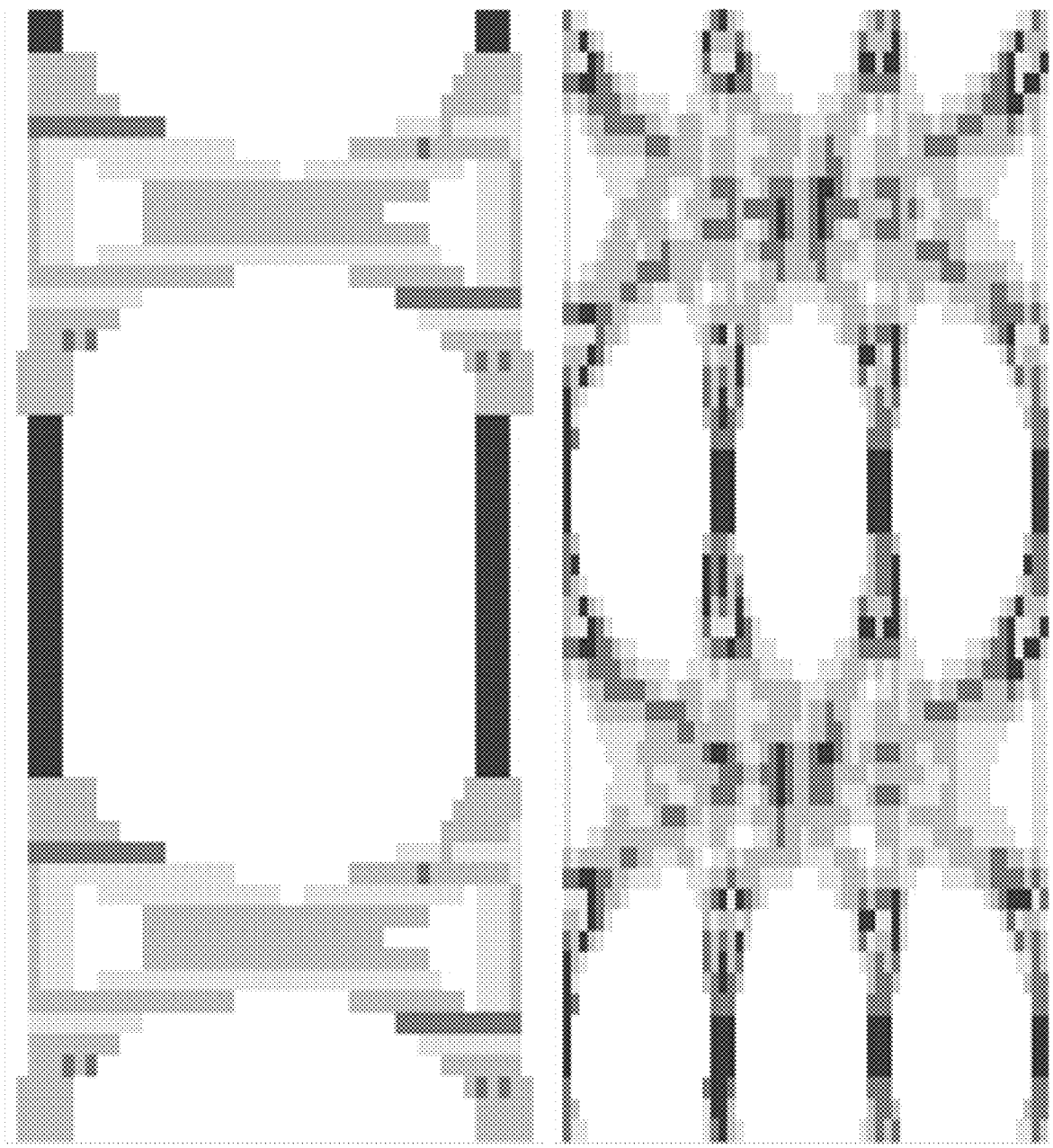
FIG. 14A is an example 1 bit/level eye diagram.
FIG. 14B is an example PAM4 eye diagram.

FIGS. 14A and 14B are the resultant eye diagrams derived from the probability density maps of FIGS. 13A and 13B using the techniques described herein.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of trouble-shooting a digital interface, the method comprising:
   a) receiving an input data stream from the digital interface in a first input of a receiver;
   b) selectively modifying a reference voltage input into a second input of the receiver;
   c) selectively modifying a clock phase input to the receiver;
   d) counting, using a counter, a number of times during a fixed time period that an output of the receiver is a predetermined value;
   e) generating a value of a pixel coordinate of a probability map by using the number of the counter;
   f) repeating b), c), d) and e) for each pixel coordinate in the probability map, wherein each pixel coordinate in the probability map is associated with a unique combination of the reference voltage input and the clock phase input;
g) generating an eye diagram using the probability map; and
h) determining signal integrity of the digital interface using the eye diagram.

2. The method of claim 1, wherein generating the eye diagram includes differentiating between adjacent pixels in the probability map.

3. The method of claim 1, wherein the digital interface is a Serializer/Deserializer (SerDes) interface.

4. The method of claim 1, wherein modifying the reference voltage input includes increasing a digital input to a digital-to-analog converter (DAC), wherein an output of the DAC is the reference voltage input.

5. The method of claim 1, wherein modifying the clock phase input includes modifying a phase shift of the clock phase input relative to an extracted clock signal of the input data stream.

6. A method, comprising:
receiving an input data stream on a receiver;
determining a probability of the input data stream being above or below a selectable threshold for a plurality of different reference voltage levels and a plurality of different clock phases, wherein control logic, coupled to the receiver, steps through the plurality of different reference voltage levels by controlling a reference voltage level to the receiver and the control logic steps through the plurality of different clock phases by changing a clock phase of a clock phase signal to the receiver;
generating a probability map wherein each different reference voltage level and each different clock phase is a point on the probability map; and
generating an eye diagram from the probability map, the eye diagram being indicative of signal integrity of the input data stream.

7. The method of claim 6, wherein the input data stream is received at a first input to the receiver, and the reference voltage level is received at a second input to the receiver, the reference voltage level being used by the receiver to determine if the input data stream is a logic low or a logic high.

8. The method of claim 7, wherein the determining of the probability includes counting a number of the logic lows or the logic highs during a predetermined time interval.

9. The method of claim 6, wherein the generating of the eye diagram includes differentiating between the points on the probability map.

10. The method of claim 6, wherein the input data stream is on a Serializer/Deserializer (SerDes) interface or a multi-level signaling interface.

11. The method of claim 6, wherein the plurality of different reference voltages are obtained by increasing an input to a digital-to-analog converter (DAC) after a predetermined time interval.

12. The method of claim 11, further including changing the plurality of different clock phases by changing a sampling time relative to the input data stream.

13. The method of claim 6, wherein the determining the probability includes counting a number of logic lows or logic highs using a single-bit gated comparator and a counter.

14. The method of claim 6, wherein the selectable threshold is a logic low or a logic high voltage level.

15. One or more non-transitory computer-readable storage medium having instructions thereon that, when executed, cause a computing system to perform the method of claim 6.

16. A system, comprising:
a receiver having a first input for receiving an input data stream, a second input for receiving a reference voltage level, a third input for receiving a clock phase signal, and an output;
a counter coupled to the output of the receiver for counting a number of times the input data stream is a logic high or a logic low over a time period;
control logic coupled to the counter and to the receiver to allow for stepping through different reference voltage levels and different clock phases by controlling the reference voltage level and the clock phase signal to the receiver and to allow for controlling the counter to count the number of times for each different reference voltage level and clock phase.

17. The system of claim 16, wherein the controlling of the clock phase signal includes modifying a relative time of a clock signal with respect to an extracted clock of the input data stream.

18. The system of claim 16, wherein the receiver is a comparator that outputs a greater value of the input data stream and the reference voltage level at a time of the clock phase signal.

19. The system of claim 16, further including clock extraction circuitry that extracts a clock signal from the input data stream, wherein the clock signal is used to generate the clock phase signal, which is a phase shifted version of the clock signal.

20. The system of claim 16, wherein the input data stream is received from a Serializer/Deserializer (SerDes) interface.

21. The system of claim 16, further including an eye diagram generator that determines signal integrity of the input data stream using the number counted by the counter.

* * * * *